US007651894B2

(12) United States Patent
Song

(10) Patent No.: US 7,651,894 B2
(45) Date of Patent: Jan. 26, 2010

(54) METHOD FOR MANUFACTURING SEMICONDUCTOR DEVICE

(75) Inventor: Myung Hwan Song, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 216 days.

(21) Appl. No.: 11/770,999

(22) Filed: Jun. 29, 2007

(65) Prior Publication Data

US 2008/0081408 A1    Apr. 3, 2008

(30) Foreign Application Priority Data

Oct. 2, 2006    (KR) ........................ 10-2006-0097106
Jun. 28, 2007    (KR) ........................ 10-2007-0064268

(51) Int. Cl.
    *H01L 21/82*    (2006.01)
(52) U.S. Cl. ........................ 438/132; 438/601
(58) Field of Classification Search ................ 438/132, 438/281, 601
    See application file for complete search history.

(56) References Cited

U.S. PATENT DOCUMENTS

2007/0170547 A1*    7/2007    Chang et al. ................ 257/532

2008/0001248 A1*    1/2008    Cheol, II ..................... 257/499

FOREIGN PATENT DOCUMENTS

| KR | 10-2000-0004350 | 1/2000 |
| KR | 10-2002-0002008 | 1/2002 |
| KR | 10-2002-0017091 | 3/2002 |
| KR | 10-2004-0074459 | 8/2004 |
| KR | 10-2006-0042356 | 5/2006 |

OTHER PUBLICATIONS

Translation of Notice of Rejection for corresponding Korean Application No. 10-2007-0064268, dated May 29, 2008.

* cited by examiner

*Primary Examiner*—Bradley K Smith
(74) *Attorney, Agent, or Firm*—Marshall, Gerstein & Borun LLP

(57) ABSTRACT

A semiconductor device manufacturing method including forming a dummy capacitor in a fuse region to avoid a step height between plate electrodes in a cell region and in a fuse region, is disclosed herein. The method can be used so that only an insulating film at a target thickness may remain on an upper part of the plate electrode in the fuse region during an etching process for forming a fuse open region, and a fuse failure due to laser blowing can be prevented.

12 Claims, 9 Drawing Sheets

METHOD FOR MANUFACTURING SEMICONDUCTOR DEVICE

CROSS-REFERENCE(S) TO RELATED APPLICATIONS

The priority benefit of Korean patent application number 10-2006-0097106, filed on Oct. 2, 2006, and Korean patent application number 10-2007-0064268, filed Jun. 28, 2007, is hereby claimed and the entire contents of thereof are hereby incorporated herein by reference.

BACKGROUND OF THE INVENTION

The present invention relates in general to a method for manufacturing a semiconductor device; and, more particularly, to a method for manufacturing a semiconductor device using a plate electrode as a fuse.

For a semiconductor memory device, high capacity DRAM devices are widely available. DRAM is defined into a memory cell region storing data or information as charge, and a peripheral circuit region for data input/output. Basically, a conventional DRAM cell consists of one transistor and one capacitor. However, reduction in design rule for highly integrated memory devices has made it difficult to ensure the required electrostatic capacity of the capacitor.

As an attempt to resolve this, a three-dimensional structure, such as a cylindrical structure or a concaved structure, was introduced for a capacitor's storage node.

In case of the cylindrical-capacitor storage node, a trench (cavity) where a capacitor's storage node is formed is provided in an oxide film, and a titanium nitride (TiN) film is deposited on the inside of the trench to form a storage node. The storage node oxide film is then removed by a full dip-out process, and a dielectric film and a plate electrode are formed.

Meanwhile, emerging trends in semiconductor devices of a high degree of integration called for an increase in memory capacity and a larger-size chip. Yet the yield of those semiconductor devices is rather low because if one single cell among numerous microcells was detected to have a defect during the manufacture of such a semiconductor device, the entire device was considered defective and had to be discarded or condemned.

Now, a memory has pre-constructed redundancy cells inside to replace cells having a defect caused during the manufacturing process, so that the entire memory can be revived, leading to an increase in the yield of chips.

When a defective memory cell is identified through a test after the completion of a wafer fabrication process, the repair work using those redundancy cells executes, in an internal circuit, a program changing an address of the defective memory cell to an address of a spare cell. Therefore, when an address signal corresponding to a defect line is input, a spare line is selected in replacement of the line having a defective cell.

To repair a defective circuit after completion of manufacturing process of a semiconductor device, an oxide film on an upper part of a fuse line is removed to open a fuse box, and a laser beam is used to blow and cut a fuse. The wiring that is disconnected by the laser beam emission is called a fuse line, and the region around the fuse line is called a fuse box.

FIGS. 1a through 1f are cross-sectional views stepwisely showing a conventional method for manufacturing a semiconductor device.

Referring to FIG. 1a, an interlayer insulating film 23 is formed over a semiconductor substrate 21 arranged for a cell region and a fuse region, and a storage node contact hole 25 exposing the semiconductor substrate 21 is formed by using a storage node contact mask.

The storage node contact hole 25 is filled to form a storage node contact plug 27.

The formation of the storage node contact plug 27 over the semiconductor substrate 21 will now be explained in detail as follows.

First of all, a device isolation film is formed over the semiconductor substrate 21 arranged for a cell region and a fuse region, and a recess gate is formed in a region arranged for a gate (not shown).

A lower insulating layer (not shown) is formed on an entire upper surface. The lower insulating layer is then etched by a lithographic-process using a landing plug contact mask, so that a landing plug contact hole is formed (not shown), exposing the semiconductor substrate 21 in a bit line contact region and in a storage node contact region.

Next, the landing plug contact hole is filled to thus form a landing plug (not shown), and a first interlayer insulating film is formed on an entire upper surface (not shown).

The first interlayer insulating film is etched by a lithographic-process using a bit line contact mask, to form a bit line contact hole (not shown).

The bit line contact hole is filled up with a conductive film to form a bit line contact plug (not shown).

A bit line (not shown) is formed on an upper part of the bit line contact plug, and a second interlayer insulating film covering the bit line 23 is formed.

The second interlayer insulating film and the first interlayer insulating film in the cell region are etched by a lithographic-process using a storage node contact mask, to form a storage node contact hole 25.

The storage node contact hole 25 is filled up with a conductive film to form a storage node contact plug 27.

An etch stop film 29 is formed on an upper part of the interlayer insulating film 23. At this time, the etch stop film is composed of a nitride film.

Next, a first sacrifice oxide film 31, a second sacrifice oxide film 33, a hard mask layer 35, and an anti-reflective film 37 are sequentially formed on an upper part of the etch stop film 29.

A first photoresist (not shown) is formed on an upper part of the anti-reflective film 37. The first photoresist is exposed and developed by a storage node mask (not shown) to form a first photoresist pattern 39.

With the first photoresist pattern 39 as a mask, the anti-reflective film 37, the hard mask layer 35, the second sacrifice oxide film 33, the first sacrifice oxide film 31, and the etch stop film 29 are etched to form a storage node region 41. Next, the first photoresist pattern 39, the anti-reflective film 37, and the hard mask layer 39 are removed (FIG. 1b).

Referring to FIG. 1c, a conductive film 43 is formed on an entire upper surface including a storage node region 41.

At this time, the conductive film 43 has a laminated structure made up of a titanium (Ti) film and a titanium nitride (TiN) film.

Referring to FIG. 1d, a second photoresist (not shown) is formed on an entire upper surface. The second photoresist is planarized until the second sacrifice oxide film 33 is exposed, and a storage node 44 is completed in this way.

Next, the second photoresist is removed, and a capping oxide film 45 is formed on an entire upper surface.

Referring to FIG. 1e, the capping oxide film 45, the second sacrifice oxide film 33, and the first sacrifice oxide film 31 are completely removed by a full dip-out process in presence of a chemical solution.

Next, a dielectric film 47 is formed on an entire surface of the storage node 44.

Referring to FIG. 1f, a TiN film 49a and a polysilicon film 49b are sequentially laminated on an upper part of the dielectric film 47 to form a plate electrode 49. In this manner, the structure of a capacitor is thus completed.

At this time, the plate electrode 49 in the fuse region is used as a fuse.

Later, a fourth interlayer insulating film (not shown), a first metal wire contact plug (not shown), a first metal wire (not shown), a fifth interlayer insulating film (not shown), a second metal wire contact plug (not shown), a second metal wire (not shown), and a protective film (not shown) are stacked on an upper part of the plate electrode 49.

A fuse open region (not shown) is formed by lithographic-process using a fuse open mask (not shown). The fourth interlayer insulating film of a designated thickness is the only thing remaining on an upper part of the plate electrode 49 in the fuse region.

Next, the plate electrode 49 in the fuse region corresponding to a defective cell is cut by a laser beam (this is a fuse blowing process).

FIGS. 2a and 2b are photos illustrating problems in a method for manufacturing a semiconductor device according to the prior art.

Referring to the photos, a large step height is formed between the plate electrodes 49 in a cell region and in a fuse region because the capping oxide film 45, the second sacrifice oxide film 33, and the first sacrifice oxide film 31 are completely removed during a full dip-out process. The fourth interlayer insulating film is thickly formed on an upper part of the plate electrode 49.

Due to the shortness height of an existing etching target, the fourth interlayer insulating film on an upper part of the plate electrode 49 may not be removed sufficiently but is formed at a thickness greater than its target thickness (about 2500 Å).

That is, the fourth interlayer insulating film having a thickness of about 12500 Å is formed in the fuse box edge section, while the fourth interlayer insulating film having a thickness of about 14000 Å is formed on the inside of the fuse box (FIG. 2b).

In short, according to the related art manufacturing method of a semiconductor device, the fourth interlayer insulating film is formed thickly on an upper part of the plate electrode due to the full dip-out process for forming a cylindrical shaped capacitor, and this causes a shortage of the etching target during the lithographic-process using a fuse open mask.

Consequently, the fourth interlayer insulating film formed on an upper part of the plate electrode has a thickness greater than its target (about 2500 Å). This thick plate electrode is not easily cut by laser blowing, but causes defects.

SUMMARY OF THE INVENTION

In view of foregoing, the present invention provides a method for manufacturing a semiconductor device, capable of forming an insulating film of a desired thickness on an upper part of a plate electrode in a fuse region during an etching process for opening a fuse by forming a dummy capacitor in the fuse region.

A method for manufacturing a semiconductor device includes the steps of: forming an insulating layer over a semiconductor substrate; removing the insulating layer by a lithographic-process using a storage node mask to form a storage node region in a cell region, and a dummy storage node region in a fuse region; forming a storage node in the cell region and forming a dummy storage node in the fuse region; performing a full dip-out process to remove the insulating layer; and sequentially forming a dielectric film and a plate layer on an entire surface of the storage node and of the dummy storage node. The forming of the storage node in the cell region and the dummy storage node in the fuse region can optionally be done at the same time.

Preferably, the exemplary method of the present invention further includes one or more steps of: forming an interlayer insulating film between the semiconductor substrate and the insulating layer, forming an etch stop film between the semiconductor substrate and the insulating layer, and sequentially forming a hard mask layer and an anti-reflective film on an upper part of the insulating layer. The insulating layer can have a laminated structure made up of a first sacrifice oxide film and a second sacrifice oxide film.

In one aspect, the step of forming the storage node region and the dummy storage node region includes: forming the storage node region by a lithographic-process using a first storage node mask defining a storage node region in a cell region; and forming the dummy storage node region by lithographic-process using a second storage node mask defining a storage node region in a fuse region.

Preferably, the step of forming the storage node region and the dummy storage node region further includes: coating a first photoresist onto an upper part of the insulating layer; exposing the first photoresist by using the first storage node mask; developing the first photoresist to form a first photoresist pattern; etching the insulating layer with the first photoresist pattern as a mask, to form a storage node region; coating a second photoresist onto an upper part of the insulating layer; exposing the second photoresist by using the second storage node mask; developing the second photoresist to form a second photoresist pattern; and etching the insulating layer with the second photoresist pattern as a mask, to form a dummy storage node region.

The step of forming the storage node region and the dummy storage node region can further include: coating a photoresist onto an upper part of the insulating layer; exposing the photoresist by using the first storage node mask; exposing the photoresist by using the second storage node mask; developing the photoresist to form a photoresist pattern; etching the insulating layer with the photoresist pattern as a mask, to form a storage node region and a dummy storage node region.

Preferably, the conductive film has a laminated structure composed of a titanium (Ti) film and a titanium nitride (TiN) film. Moreover, a capping oxide film preferably is formed on an entire upper surface, after the storage node and the dummy storage node are formed. Here, the capping oxide film can be removed during the full dip-out process. Furthermore, the plate electrode preferably comprises a titanium nitride (TiN) film and a polysilicon film.

As has been explained, according to the semiconductor device manufacturing method described herein, a dummy capacitor can be formed in a fuse region to avoid a step height between plate electrodes in a cell region and in a fuse region. In this manner, an insulating film with a desired thickness may remain on an upper part of the plate electrode in the fuse region during an etching process for forming a fuse open region, and a fuse failure due to laser blowing, a post-process, can be prevented.

Further aspects and advantages will be apparent to those of ordinary skill in the art from a review of the following detailed description, taken in conjunction with the drawings. While the method is susceptible of embodiments in various forms, the description hereafter includes specific embodiments with the understanding that the disclosure is illustrative, and is not intended to limit the invention to the specific embodiments described herein.

DESCRIPTION OF SPECIFIC EMBODIMENTS

Hereinafter, embodiments are set forth in detail with reference to the accompanying drawings so that those skilled in the art can easily carry out the invention.

FIGS. 3a through 3h are cross-sectional views stepwise showing a method for manufacturing a semiconductor device according to a preferred embodiment of the present invention.

Figure 1A:
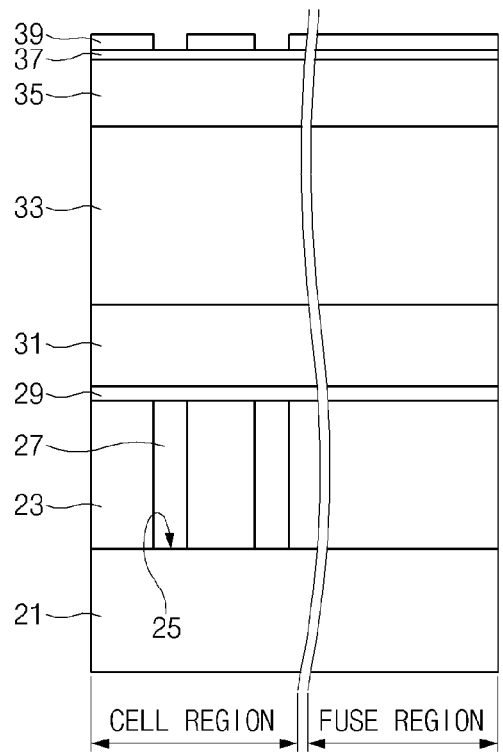
FIGS. 1a through 1f are cross-sectional views stepwise showing a conventional method for manufacturing a semiconductor device.
Figure 1B:
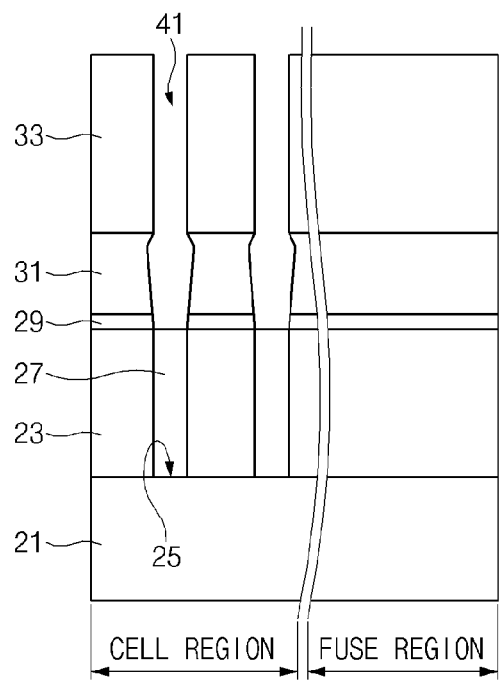
Figure 1C:
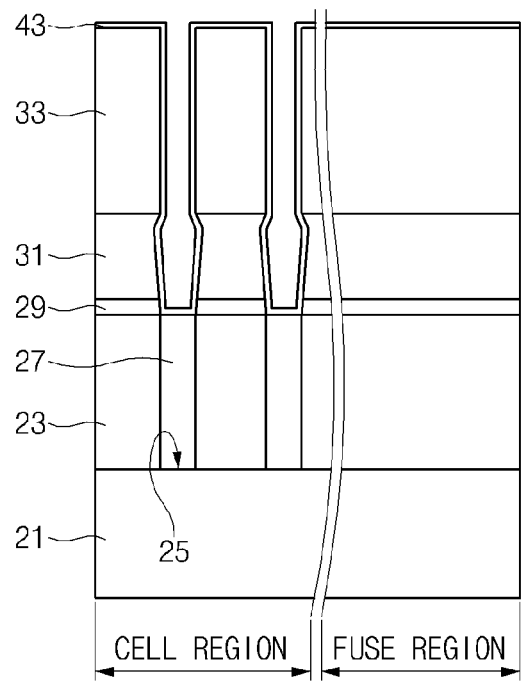
Figure 1D:
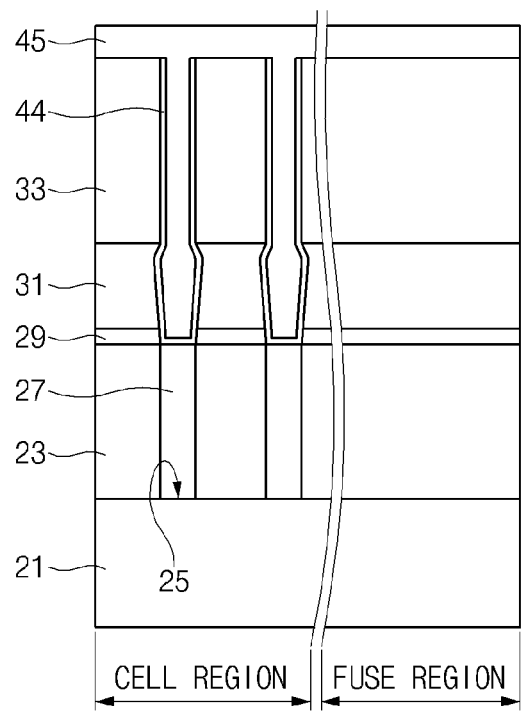
Figure 1E:
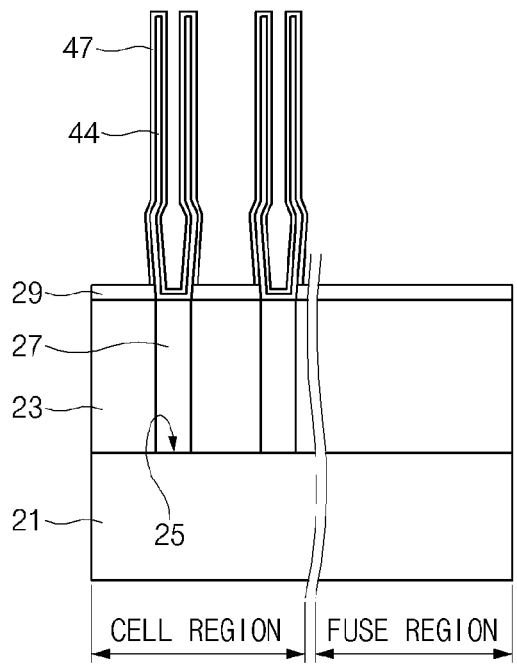
Figure 1F:
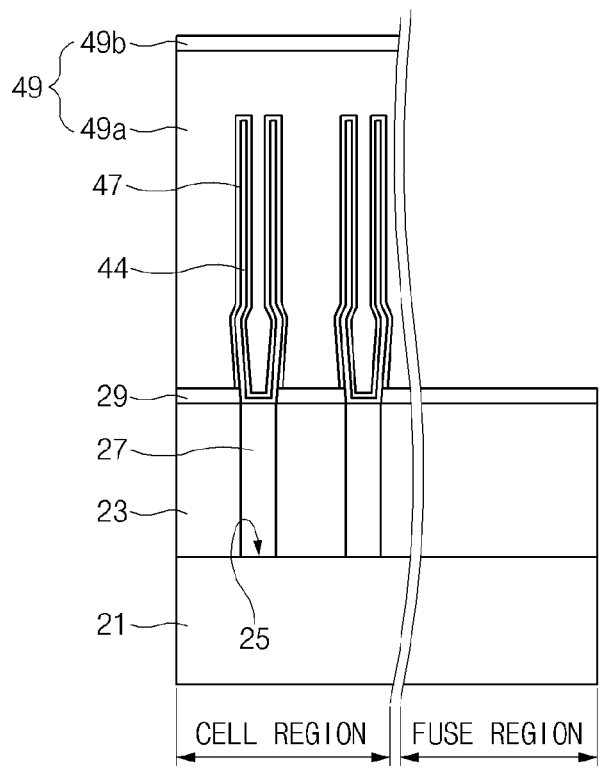
Figure 2A:
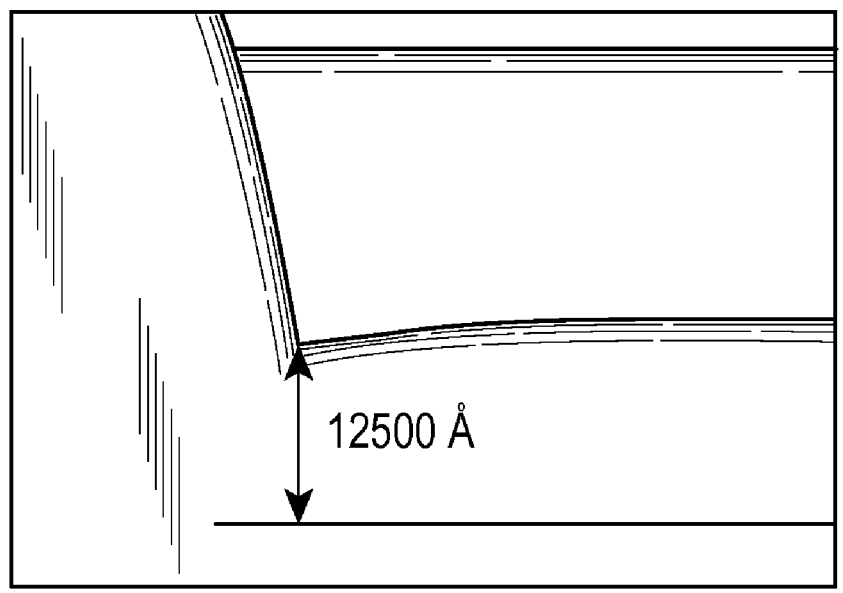
FIGS. 2a and 2b are photos illustrating problems in a method for manufacturing a semiconductor device according to a related art.
Figure 2B:
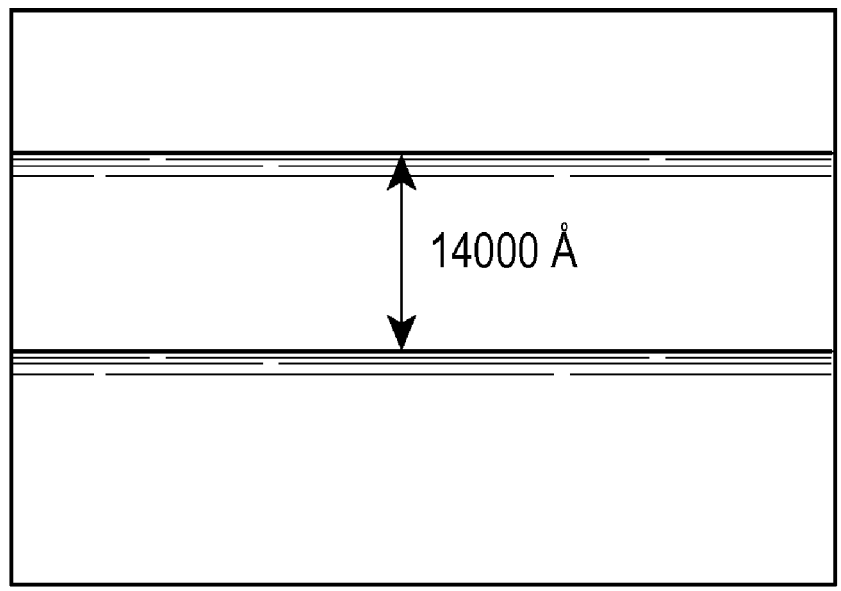
Figure 3A:
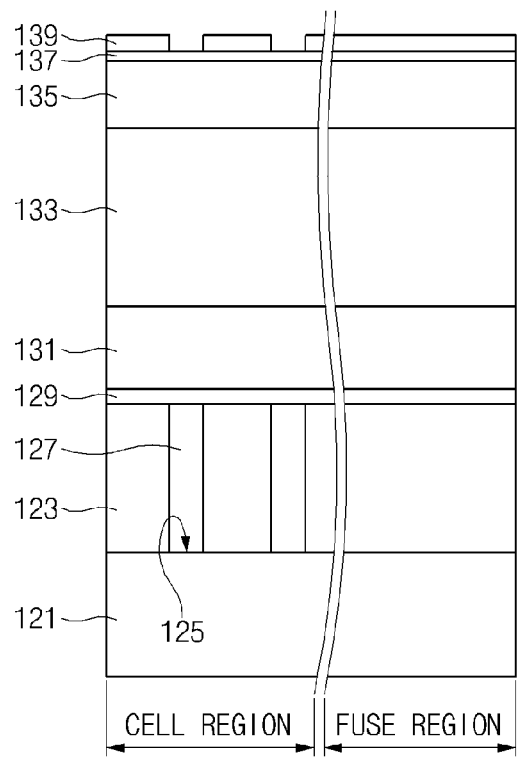
FIGS. 3a through 3h are cross-sectional views stepwise showing a method for manufacturing a semiconductor device according to a preferred embodiment of the present invention.

Referring to FIG. 3a, an interlayer insulating film 123 is formed over a semiconductor substrate 121 arranged for a cell region and a fuse region, and a storage node contact hole 125 exposing the semiconductor substrate 121 is formed by using a storage node contact mask.

The storage node contact hole 125 is filled to form a storage node contact plug 127.

The formation of the storage node contact plug 127 over the semiconductor substrate 121 will now be explained in detail as follows.

First of all, a device isolation film is formed in the semiconductor substrate 121 arranged for a cell region and a fuse region, and a recess gate is formed in a region arranged for a gate.

A lower insulating layer is formed on an entire upper surface. The lower insulating layer is then etched by a lithographic-process using a landing plug contact mask, so that a landing plug contact hole exposing the semiconductor substrate 121 in a bit line contact region and in a storage node contact region may be formed.

Next, the landing plug contact hole is filled to thus form a landing plug, and a first interlayer insulating film is formed on an entire upper surface.

The first interlayer insulating film is etched by a lithographic-process using a bit line contact mask, to form a bit line contact hole.

The bit line contact hole is filled with a conductive film to form a bit line contact plug.

A bit line is formed on an upper part of the bit line contact plug, and a second interlayer insulating film covering the bit line is formed.

The second interlayer insulating film and the first interlayer insulating film in the cell region are etched by a lithographic-process using a storage node contact mask, to form a storage node contact hole.

The storage node contact hole is filled with a conductive film to form a storage node contact plug 127.

An etch stop film 129 is formed on an upper part of the interlayer insulating film 123. The etch stop film 129 can be composed of a nitride film.

Next, a first sacrifice oxide film 131, a second sacrifice oxide film 133, a hard mask layer 135, and an anti-reflective film 137 are sequentially formed on an upper part of the etch stop film 129.

A first photoresist (not shown) is formed on an upper part of the anti-reflective film 137. The first photoresist is exposed and developed by a storage node mask (not shown) to form a first photoresist pattern 139.

Figure 3B:
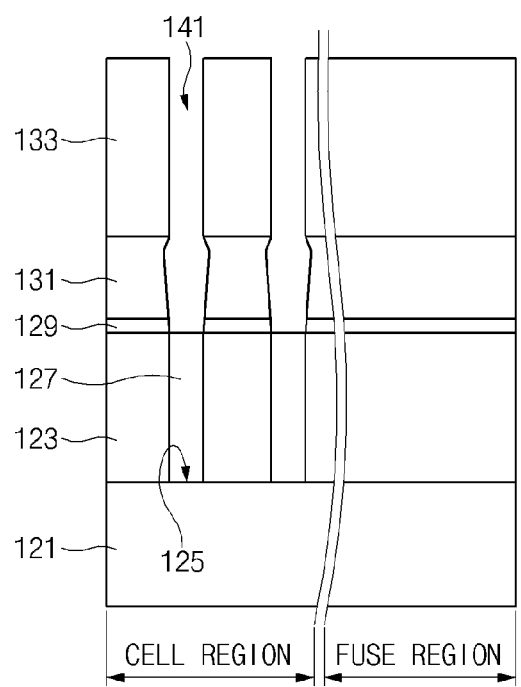

Referring to FIG. 3b, with the first photoresist pattern 139 as a mask, the anti-reflective film 137, the hard mask layer 135, the second sacrifice oxide film 133, the first sacrifice oxide film 131, and the etch stop film 129 are etched, to form a storage node region 141.

Next, the first photoresist pattern 139, the anti-reflective film 137, and the hard mask layer 135 are removed.

Figure 3C:
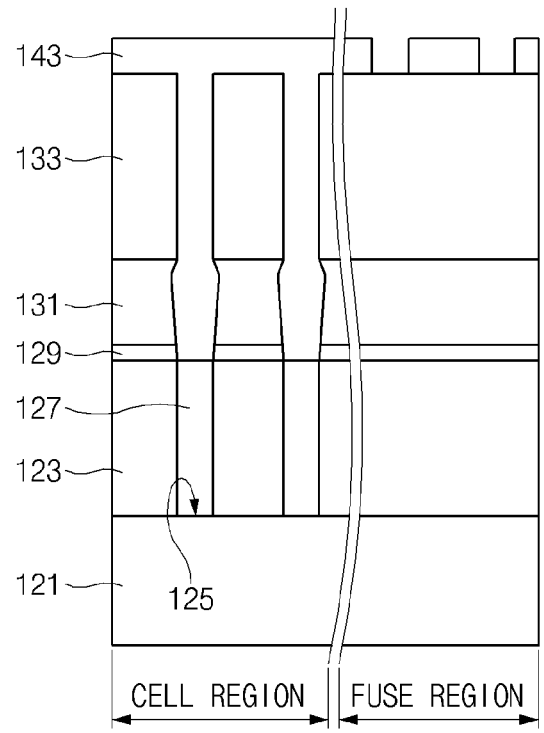

Referring to FIG. 3c, a second photoresist (not shown) is formed on an entire upper surface. With a storage node mask (not shown) used for a fuse region, the second photoresist is exposed and developed to form a second photoresist pattern 143.

Figure 3D:
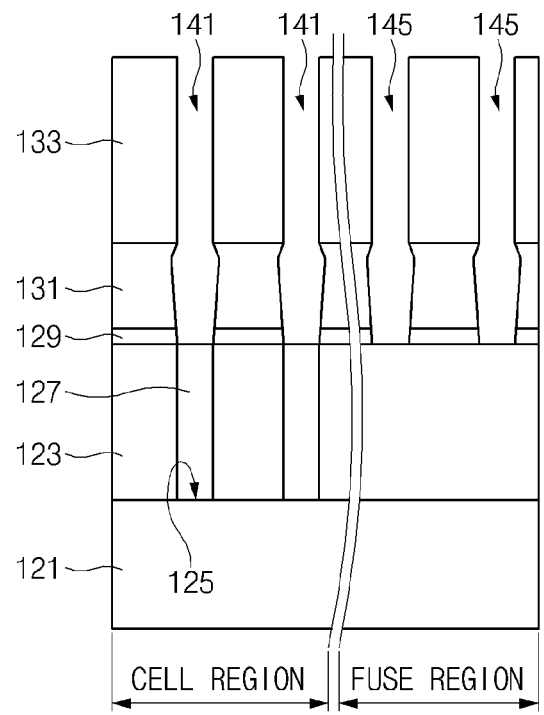

Referring to FIG. 3d, the second sacrifice oxide film 133, the first sacrifice oxide film 131, and the etch stop film 129 are etched using the second photoresist pattern 143 as a mask, to form a dummy storage node region 145.

The second photoresist pattern 143 is removed.

Here, the storage node region 141 and the dummy storage node region 145 in FIGS. 3c and 3d may be formed as follows. A photoresist is coated over an upper part of the second sacrifice oxide film 133 and exposed using a storage node mask ($1^{st}$ exposure process). A second exposure process is carried out by using a storage node mask used for a fuse region, and a photoresist pattern is formed by developing in a cell region and a fuse region. Finally, with this photoresist pattern as a mask, the anti-reflective film 137, the hard mask layer 135, the second sacrifice oxide film 133, the first sacrifice oxide film 131, and the etch stop film 129 are etched.

At this time, the photoresist pattern takes a combination form of the first photoresist pattern 139 and the second photoresist pattern 143.

Figure 3E:
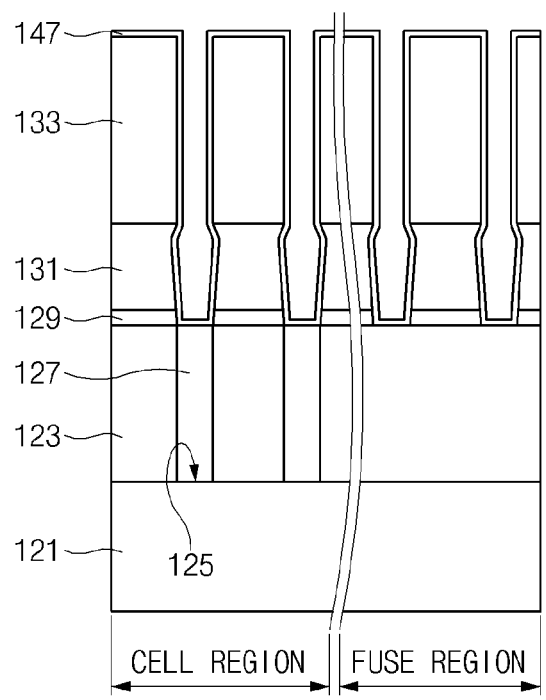

Referring to FIG. 3e, in case of forming the storage node region 141 and the dummy storage node region 145 by using the photoresist pattern in combination of the first and second photoresist patterns 139 and 143 as a mask, the anti-reflective film 137 formed on an upper part of the second sacrifice oxide film 133, and the hard mask layer 135 are removed.

Next, a conductive film 147 is formed on an entire upper surface including the storage node region and the dummy storage node region 141 and 145.

Desirably, the conductive film 147 may have a laminated structure made up of a Ti film and a TiN film.

Figure 3F:
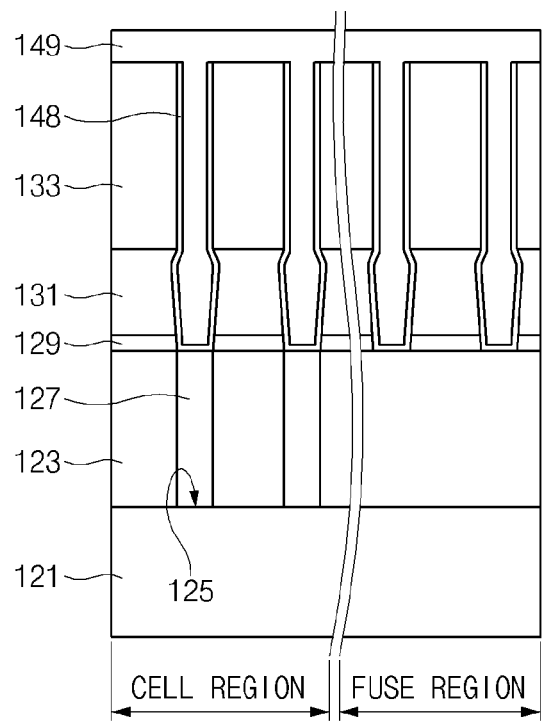

Referring to FIG. 3f, a third photoresist (not shown) is formed on the entire upper surface.

A planarization process is carried out until the second sacrifice oxide film 133 is exposed. In so doing, the third photoresist remains in the storage node region and the dummy storage node region 141 and 145.

Next, the third photoresist is removed from the storage node region and the dummy storage node region 141 and 145 to form a storage node 148 in the storage node region 141 in a cell region and in the dummy storage node region 145 in a fuse region, respectively.

Desirably, the storage node 148 formed in the dummy storage node region 145 of the fuse region is a dummy storage node.

A capping oxide film 149 that fills up the storage node region and the dummy storage node region 141 and 145 is formed on the entire upper surface.

Figure 3G:
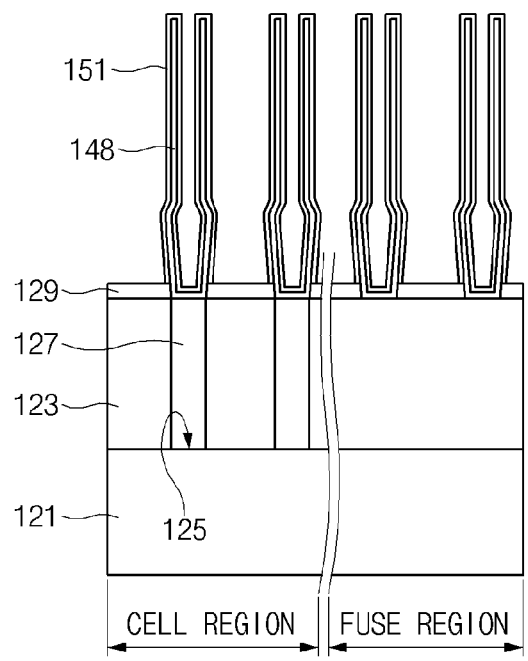

Referring to FIG. 3g, the capping oxide film 149, the second sacrifice oxide film 133, and the first sacrifice oxide film 131 are completely removed by a full dip-out process in presence of a chemical solution.

Next, a dielectric film 151 is formed on an entire surface of the storage node 148.

Figure 3H:
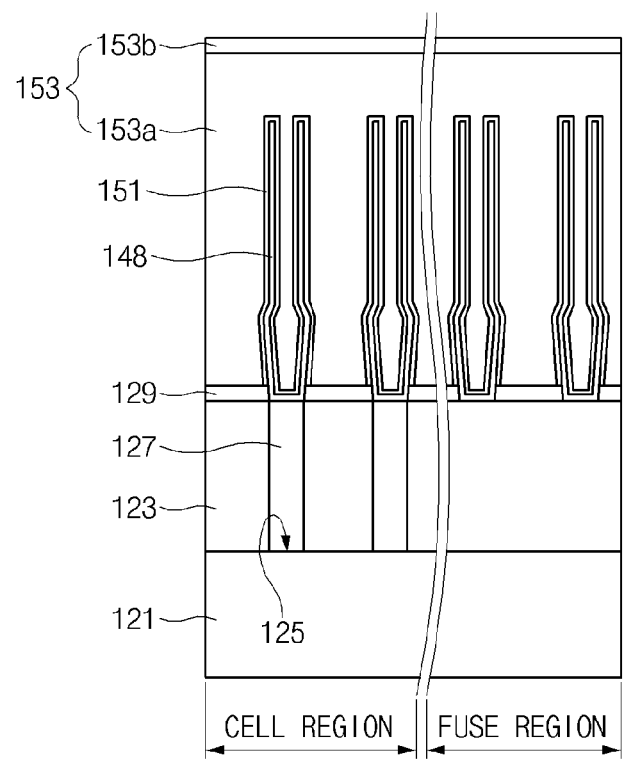

Referring to FIG. 3h, a TiN film 153a and a polysilicon film 153b are sequentially laminated on an upper part of the dielectric film 151 to form a plate electrode 153. In this manner, the structure of a capacitor in the cell region and a dummy capacitor (161 of FIG. 4) in the fuse region are thus completed.

At this time, the plate electrode 153 in the fuse region is used as a fuse.

Later, a fourth interlayer insulating film (not shown), a first metal wire contact plug (not shown), a first metal wire (not shown), a fifth interlayer insulating film (not shown), a second metal wire contact plug (not shown), a second metal wire (not shown), and a protective film (not shown) are stacked on an upper part of the plate electrode 153.

A fuse open region (not shown) is formed by lithographic-process using a fuse open mask (not shown). The fourth interlayer insulating film of a designated thickness is the only thing remaining on an upper part of the plate electrode 153 in the fuse region.

Next, the plate electrode 153 in the fuse region corresponding to a defective cell is cut by a laser beam (this is a fuse blowing process).

Figure 4:
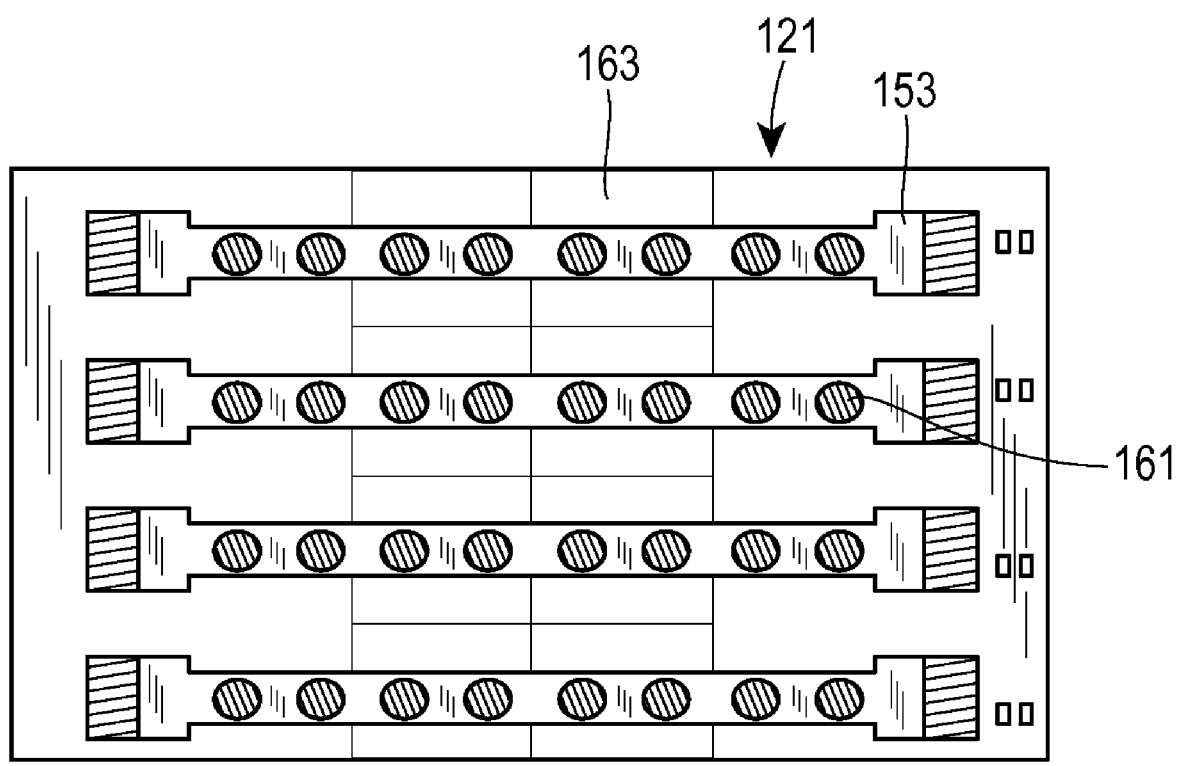
FIG. 4 is a plan view of a semiconductor device according to a preferred embodiment of the present invention.

FIG. 4 is a plan view of a semiconductor device according to a preferred embodiment of the present invention.

As is apparent from the drawing, a dummy capacitor 161 is formed over a semiconductor substrate 121 in a fuse region.

As the fourth interlayer insulating film that needs to be removed for forming a fuse open region 163 now has a reduced thickness, compared with the thickness of a conventional one, only the fourth interlayer insulating film with a target thickness remains on an upper part of the plate electrode 153 in the fuse region.

Therefore, the semiconductor device manufacturing method of the present invention can be advantageously used for making the fourth interlayer insulating film formed on an upper part of the plate electrode 153 in the fuse region thinner than a conventional one, by forming the dummy capacitor in the fuse region to get rid of the step height between plate electrodes 153 formed in the cell region and in the fuse region.

That is, during the fuse open region forming process, the fourth interlayer insulating film with a target thickness is the only thing remaining on an upper part of the plate electrode 153 in the fuse region.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a semiconductor device, comprising the steps of:
   forming an insulating layer over a semiconductor substrate;
   removing the insulating layer by a lithographic-process using a storage node mask to form a storage node region in a cell region, and a dummy storage node region in a fuse region;
   forming a storage node in the cell region and forming a dummy storage node in the fuse region;
   performing a full dip-out process to remove the insulating layer; and
   sequentially forming a dielectric film and a plate layer on an entire surface of the storage node and of the dummy storage node.

2. The method of claim 1, further comprising:
   forming an interlayer insulating film between the semiconductor substrate and the insulating layer.

3. The method of claim 1, further comprising:
   forming an etch stop film between the semiconductor substrate and the insulating layer.

4. The method of claim 1, wherein the insulating layer has a laminated structure made up of a first sacrifice oxide film and a second sacrifice oxide film.

5. The method of claim 1, further comprising:
   sequentially forming a hard mask layer and an anti-reflective film on an upper part of the insulating layer.

6. The method of claim 1, wherein the step of forming the storage node region and the dummy storage node region comprises:
   forming the storage node region by a lithographic-process using a first storage node mask defining a storage node region in a cell region; and
   forming the dummy storage node region by a lithographic-process using a second storage node mask defining a storage node region in a fuse region.

7. The method of claim 6, wherein the step of forming the storage node region and the dummy storage node region further comprises:
   coating a first photoresist onto an upper part of the insulating layer;
   exposing the first photoresist by using the first storage node mask;
   developing the first photoresist to form a first photoresist pattern;
   etching the insulating layer with the first photoresist pattern as a mask, to form a storage node region;
   coating a second photoresist onto an upper part of the insulating layer;
   exposing the second photoresist by using the second storage node mask;
   developing the second photoresist to form a second photoresist pattern; and
   etching the insulating layer with the second photoresist pattern as a mask, to form a dummy storage node region.

8. The method of claim 6, wherein the step of forming the storage node region and the dummy storage node region further comprises:
   coating a photoresist onto an upper part of the insulating layer;
   exposing the photoresist by using the first storage node mask;
   exposing the photoresist by using the second storage node mask;
   developing the photoresist to form a photoresist pattern;
   etching the insulating layer with the photoresist pattern as a mask, to form a storage node region and a dummy storage node region.

9. The method of claim 1, wherein the conductive film has a laminated structure composed of a titanium (Ti) film and a titanium nitride (TiN) film.

10. The method of claim 1, further comprising:
    forming a capping oxide film on an entire upper surface of the storage node and of the dummy storage node, after the storage node and the dummy storage node are formed.

11. The method of claim 10, wherein the capping oxide film is removed during the full dip-out process.

12. The method of claim 1, wherein the plate electrode comprises a titanium nitride (TiN) film and a polysilicon film.

* * * * *